US012411154B2

United States Patent
Vavra et al.

(10) Patent No.: US 12,411,154 B2
(45) Date of Patent: Sep. 9, 2025

(54) PNEUMATIC SEMICONDUCTOR SOCKET LID ASSEMBLY

(71) Applicant: Ironwood Electronics, Inc., Eagan, MN (US)

(72) Inventors: Jacob Vavra, Minneapolis, MN (US); Ilavarasan M. Palaniappa, Inver Grove Heights, MN (US); David A. Struyk, Deephaven, MN (US)

(73) Assignee: Ironwood Electronics. Inc.

( * ) Notice: Subject to any disclaimer, the term of this patent is extended or adjusted under 35 U.S.C. 154(b) by 183 days.

(21) Appl. No.: 18/464,533

(22) Filed: Sep. 11, 2023

(65) Prior Publication Data

US 2024/0094242 A1   Mar. 21, 2024

Related U.S. Application Data

(60) Provisional application No. 63/376,010, filed on Sep. 16, 2022.

(51) Int. Cl.
| | |
|---|---|
| G01R 1/04 | (2006.01) |
| G01R 1/02 | (2006.01) |
| G01R 1/067 | (2006.01) |
| G01R 1/073 | (2006.01) |
| G01R 19/32 | (2006.01) |
| G01R 31/10 | (2006.01) |
| G01R 31/26 | (2020.01) |
| G01R 31/28 | (2006.01) |

(52) U.S. Cl.
CPC ................ *G01R 1/0433* (2013.01)

(58) Field of Classification Search
CPC . G01R 1/02; G01R 1/04; G01R 1/067; G01R 1/073; G01R 31/10; G01R 31/26; G01R 31/28; G01R 31/2862; G01R 31/2875; G01R 31/2877; G01R 19/32
See application file for complete search history.

(56) References Cited

U.S. PATENT DOCUMENTS

| | | | |
|---|---|---|---|
| 9,007,080 B2 | 4/2015 | Barabi et al. | |
| 9,383,406 B2 * | 7/2016 | Barabi | G01R 1/0458 |

FOREIGN PATENT DOCUMENTS

WO   WO-2017210108 A1 * 12/2017   ........... G01R 1/0458

* cited by examiner

*Primary Examiner* — Neel D Shah

(74) *Attorney, Agent, or Firm* — Schroeder & Siegfried, P.A.

(57) ABSTRACT

A socket lid for a semiconductor test socket which uses a plurality of pneumatic cylinders integrated into the socket lid to facilitate the application of a controlled and variable force to multiple zones of an electronic circuit device carried by the test socket. The socket lid includes a cylinder casing with multiple independently sealed pressure chambers, each of which incorporates a plurality a pneumatic cylinders which bear against separate and independently movable compression plates that engage different areas of the electronic circuit device carried by the semiconductor test socket, thus providing an adjustably variable force to multiple zones of the electronic circuit device under test.

20 Claims, 4 Drawing Sheets

PNEUMATIC SEMICONDUCTOR SOCKET LID ASSEMBLY

CROSS REFERENCE TO RELATED APPLICATIONS

This application is a nonprovisional patent application which claims the benefit of U.S. Provisional Application Ser. No. 63/376,010, filed on Sep. 16, 2022, entitled "Pnuematic Semiconductor Socket Lids," the contents of which are incorporated herein in their entirety by reference thereto.

FIELD OF INVENTION

The present invention relates generally to the art of semiconductor test sockets, and more particularly to the construction of an improved easy-to-use socket lid which may be used to align and apply variable pressure as needed to an electronic circuit device under test (DUT).

BACKGROUND

The statements in this section merely provide background information related to the present disclosure and may not constitute prior art.

"Semiconductor test socket" is a broad descriptor of a system that makes an electrical connection between a DUT and a test board. In general, this system is made up of a mechanical fixture used to align and compress the DUT onto an electrical contact. While there are many different types of electrical contacts on the market, most of them will require a specified amount of mechanical force to make contact. The part of the assembly that applies this force is the socket lid. The lid assembly comes in a variety of shapes and styles depending on the number of contacts and the size of the device.

In basic applications, a compression screw in the socket lid applies force to a compression plate, which distributes force to the DUT. The number of electrical contacts drives the size and number of screws. The issue this design poses is that as the screw size increases, the standard thread pitch also increases, resulting in more torque required to apply the needed force. Simply increasing the number of screws or decreasing the pitch of the screw results in other unnecessary complications for users and high costs in custom hardware. An increased number of screws also makes it more difficult to keep uniform pressure against the DUT.

Springs can be used in place of or in addition to compression screws and can mitigate the limitation of a compression screw-only assembly. For both low-pin and high-pin count assemblies, springs aid in keeping uniform force across the DUT, especially when used in addition to compression screws. They also reduce the incidence of operator error. In the highest force applications, a compression plate supported by springs with an upper compression assembly can successfully be used; however, this has the disadvantage of requiring a high number of screws to properly secure the assembly.

In low force applications, a spring-loaded assembly can be used entirely without a compression screw to simplify the operation of the socket. These solutions generally replace the compression screw with either 1) a latch and hinge pin, called a clamshell socket, or 2) two latches, called a double latch. These are very convenient for the operator as they do not require the use of a torque wrench. The two major drawbacks are that the DUT thickness must be uniform and the applied force cannot exceed 20 lbs. of force.

When ease of use is needed in higher-force applications, e.g., 20+ lbs., lid assemblies will include a leverage mechanism. The most commonly used example of this is the simple compression screw design detailed prior. While this is sufficient in most cases, it has shortcomings in the amount of exerted effort and the potential for user error. To counter these disadvantages, a lever and cam can be used instead. This allows for a simple open or closed operation of the lid assembly with the closed or connected state being calibrated to the correct force. The mechanism also allows for a substantially higher amount of force, up to 1000 lbs., to be exerted with minimal effort from the user. The disadvantages of this system are in the precision machining needed to accurately apply the correct force and the inability of the force to be adjusted. A minor disadvantage is in the general wear on the socket mechanisms themselves, but almost all mentioned lid solutions share a similar component lifetime.

To summarize, conventional socket lids presently available in the market suffer from the following limitations:

High-force lids that are adjustable in force are difficult to use

High force lids that are easy to use are not able to manage an adjustable amount of force Most lid solutions can only apply a uniform force over the entire DUT with no ability to change a local force applied on the device Torque-controlled lid solutions have a non-constant value of friction that affects the accuracy of force applied The friction value is also affected by the wear of the lid over its working life Lever-lid sockets have a limited lifetime on all cam locations and require replacement parts Lever-lid sockets rely on springs to distribute force which can vary depending on operating temperature High component count lid assemblies rely on high precision tolerance to ensure the proper force is applied Accordingly, it is evident that there is a distinct need in the industry for a simplified socket lid solution for aligning and applying an adjustable force to a DUT which is easy to use in both low-pressure and high-pressure applications and avoids the many aforementioned deficiencies of conventional socket lid devices.

SUMMARY

As discussed, there are already a wide variety of various conventional socket lid technologies that have suitable uses based on the particular application. What is missing, however, is an easy-to-use solution that is flexible in both low-pressure and high-force applications.

Therefore, one object of the present invention is to provide an easy-to-use socket lid device that is capable of applying a controlled and variable amount of force to a DUT in both low-pressure and high-pressure applications.

Another object is to provide a socket lid device which is capable of applying multiple zones of controlled and variable force to a DUT.

Still another object of the present invention is to provide a socket lid device that is capable of applying such a multi-zone controlled and variable force to a DUT in applications having tight space constraints.

Another object is to provide a socket lid solution which avoids the need for numerous precision components, springs, etc., as well as the wear and tear and stack tolerances associated therewith.

Still further, it is also a desire to provide such a socket lid design which helps mitigate the adverse effects of mechanical and thermal shock to the DUT and avoids complications in maintaining accuracy of applied force to the DUT due to non-constant values of contact friction.

In furtherance of the foregoing objectives, the present invention incorporates a novel approach to socket lid technology which uses a plurality of pneumatic cylinders integrated into the socket lid to facilitate the application of a controlled and variable force over multiple zones to the DUT. Through the use of pneumatics, compressed air can be used to control and vary the force exerted by a socket lid to multiple different zones of the DUT with a relatively simple adjustment of the cylinder air pressure.

Although pneumatic air cylinders are known generally for use in applying pressure, air cylinders are bulky and do not work well in many applications where it is common to have tight space constraints, such as with semiconductor test sockets. Accordingly, in place of using an available air cylinder to apply force to the assembly, in the present invention, it is contemplated that the air cylinder be machined as a part of the socket lid assembly itself.

The benefits of this approach are that force can be varied depending on the amount of pressure applied to the cylinder, rather than through complicated and tedious mechanical adjustments. The applied force may be controlled by the accuracy of the regulated air instead of the precision of socket lid components, thus eliminating the impact of the component's tolerance stack.

This approach also eliminates any issues with space limitations and allows for the use of more than one cylinder in the assembly. The number of cylinders and their size is only limited by the footprint of the lid solution, which allows for multiple zones of controlled force to be applied against the DUT. With this approach, any size and number of cylinders can be integrated into a socket lid. Issues with mechanical and thermal shock may also be mitigated, and well as difficulties caused by varying contact resistance.

The foregoing and additional features and advantages of the present invention will be more readily apparent from the following detailed description. It should be understood, however, that the description and specific examples herein are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
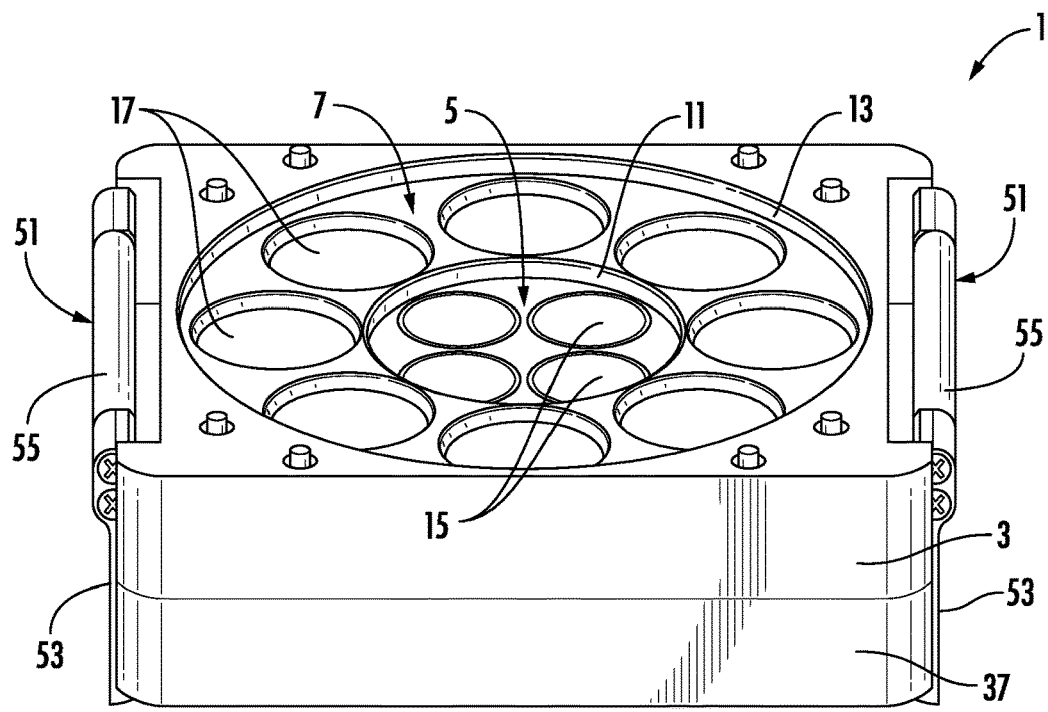
FIG. 1 is a perspective view of a pneumatic socket lid assembly constructed in accordance with the present invention, with the socket lid cover removed to show one contemplated layout for the positioning of the pistons for the integrated pneumatic cylinders.

The following description is merely exemplary in nature and is not intended to limit the present disclosure, application, or uses. It should be understood that throughout the drawings, corresponding reference numerals indicate like or corresponding parts and features.

With reference to FIG. 1 of the drawings, a socket lid assembly 1 constructed in accordance with the present invention is disclosed (without its socket lid cover). The socket lid assembly 1 includes a pneumatic cylinder casing 3 configured with an inner pressure chamber 5 and a separate surrounding peripheral pressure chamber 7. Chambers 5 and 7 are sealed from one another via a set of O-rings carried on the underside (not shown) of the socket lid cover 9 (see FIG. 2), which bear against shoulders 11 and 13 formed in cylinder casing 3. Socket lid cover 9, in turn, is secured in sealed relation to the top of the pneumatic cylinder casing 3.

As seen in FIG. 1, a plurality of smaller cylinder bore openings 15 within the confines of inner chamber 5 are integrally formed with and extend through casing 3. Similarly, a plurality of larger cylinder bore openings 17 which are integrally formed as part of the surrounding peripheral chamber 7 also extend through casing 3. As shown best in FIGS. 4 and 5, each of the openings 15 formed in inner chamber 5 is adapted to receive in sealed relation an appropriately sized piston rod assembly 19. Also, each of the openings 17 formed in peripheral chamber 7 is adapted to receive in sealed relation an appropriately sized piston rod assembly 21. Together, the pneumatic cylinder casing 3, socket lid cover 9, and enclosed piston rod assemblies 19 and 21, form a plurality of integrated pneumatic cylinders within separate chambers 5 and 7 of the socket lid assembly 1.

Figure 5:
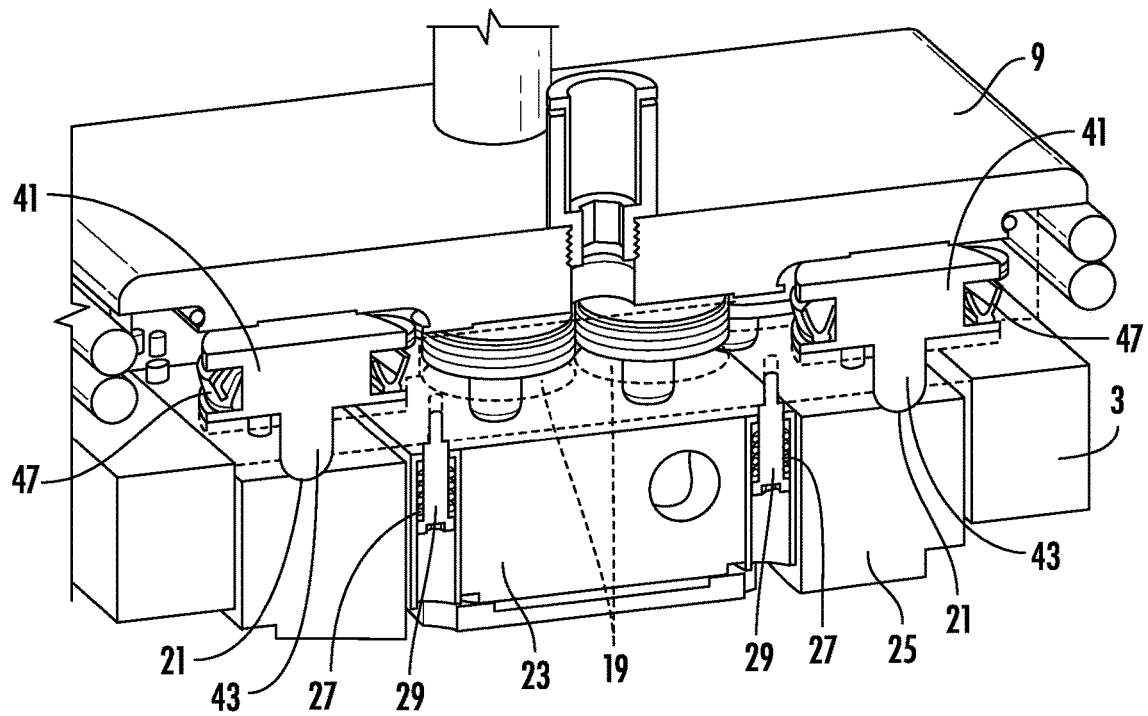
FIG. 5 is a close-up perspective cross section view of the pneumatic socket lid assembly of FIGS. 1-4, showing the detailed construction of the pneumatic cylinders bearing against the inner and outer lower compression plates of the socket lid assembly.
Figure 6:
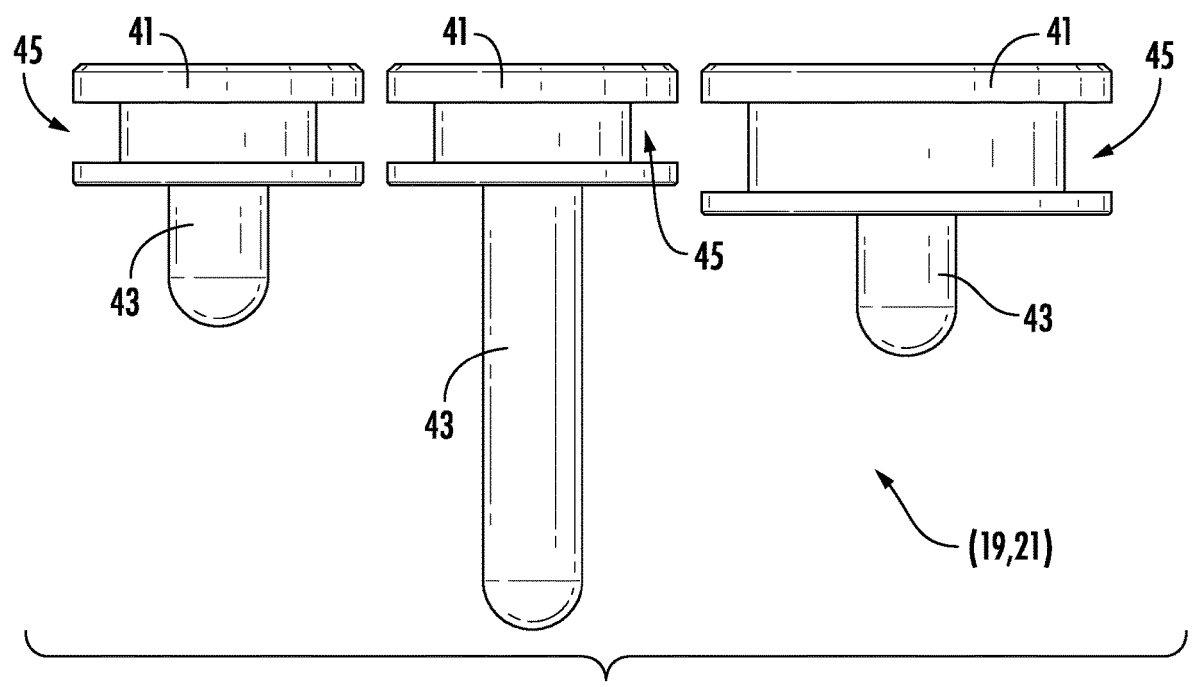
FIG. 6 is a side elevation view of various possible embodiments of the piston rod assemblies for the pneumatic cylinders with different sizes and lengths based on the requirements for a particular application.

The construction of each piston rod assembly 19 and 21 is best described in reference to FIGS. 5 and 6. As shown, each piston rod assembly (19, 21) is comprised of a main body section 41 with a lower rod 43 protruding downwardly therefrom. The main body section 41 includes an annular groove 45 extending around the middle peripheral portion thereof. As illustrated best in FIG. 6, each piston rod assembly (19, 21) may be constructed of a different size and/or length, depending on the requirements of a particular application.

As seen in FIG. 5, seated within the annular groove 45 of each piston rod assembly (19, 21) is a U-cup sealing member 47. The sealing member 47 has a generally U-shaped cross-sectional configuration which, in free form, is constructed to protrude radially outward slightly from the confines of groove 45. Thus, when the piston rod assemblies (19, 21) are installed within their respective cylinder bore openings (15, 17) of pneumatic cylinder casing 3, the U-Cups 47 create a seal against the inner walls of such bores (15, 17). Accordingly, the sealed piston rod assemblies (19, 21) are permitted to move up and down within their respective piston bores (15, 17) in response to changes in air pressure introduced into chambers 5 and 7 of pneumatic cylinder casing 3.

Positioned below the pneumatic cylinder casing 3 in engaging relation with the lower rods 43 of piston rod assemblies 19 and 21, respectively, are inner and outer compression plates 23 and 25. As shown, the inner compression plate 23 is secured in movable relation to the underside of the pneumatic cylinder casing 3 via a series of compression springs 27 and shoulder bolts 29. The compression springs 27 tend to bias the compression plate 23 upwardly against the piston rod assemblies 19 within pressure chamber 5. Similarly, the outer compression plate 25 is secured in movable relation to the underside of the pneumatic cylinder casing 3 via a series of compression springs 31 and shoulder bolts 33. The compression springs 31 tend to bias the compression plate 25 upwardly against the piston rod assemblies 21 within pressure chamber 7.

As shown best in FIG. 5, the piston rod assemblies 19 contained within pressure chamber 5 are aligned with and bear against the inner compression plate 23 only. The outer piston rod assemblies 21 within pressure chamber 7, on the other hand, are aligned with and bear only against the outer compression plate 25. Accordingly, changes in air pressure supplied to chamber 5 of the pneumatic cylinder casing 3 will translate through piston rod assemblies 19 only, thereby altering the force applied to the inner compression plate 23. In the same manner, changes in air pressure supplied to chamber 7 of the pneumatic cylinder casing 3 will translate through piston rod assemblies 21 only, thereby altering the force applied to the outer compression plate 23.

Figure 4:
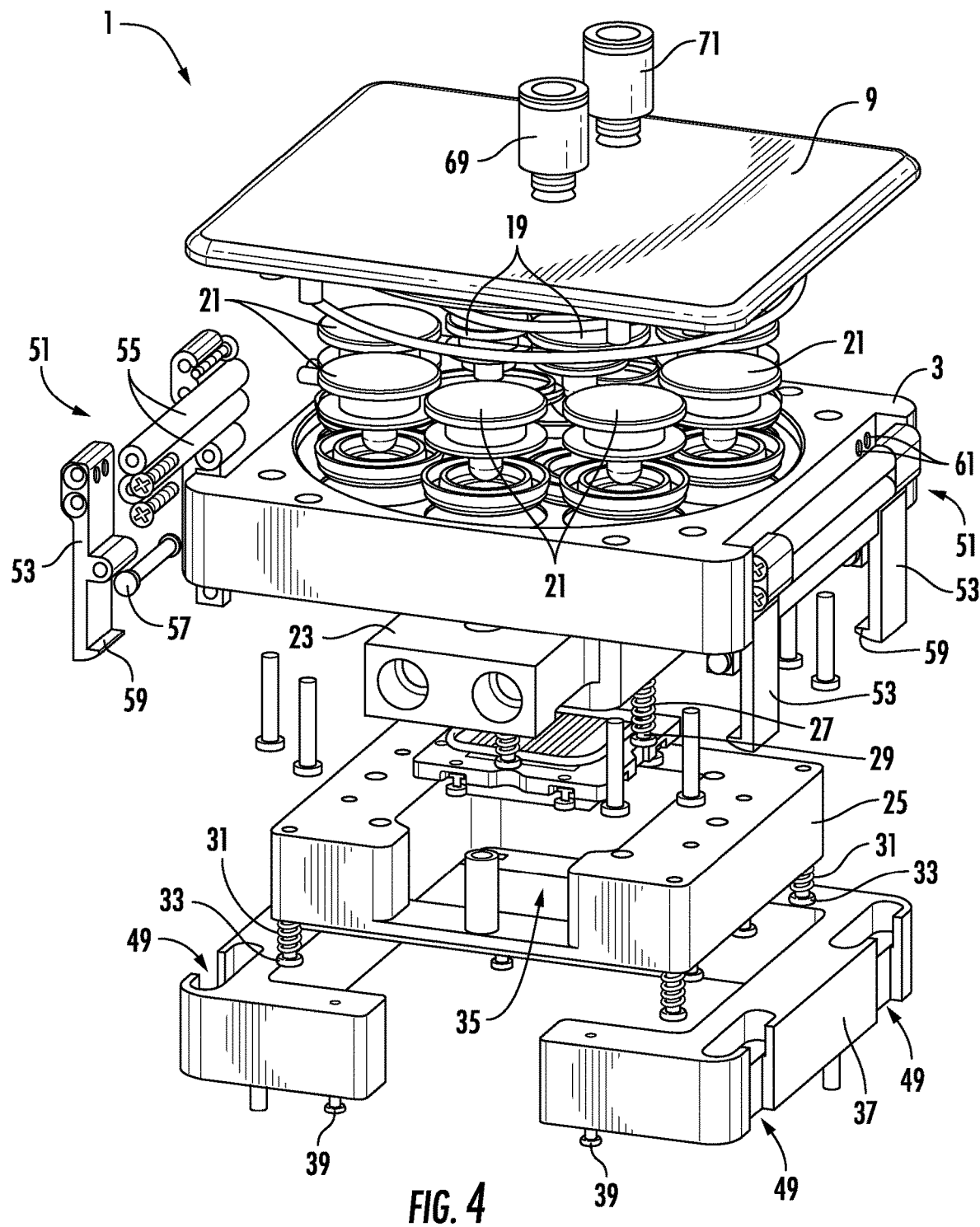
FIG. 4 is an exploded perspective view of the pneumatic socket lid assembly shown in FIGS. 1-3.

As shown further in FIGS. 4 and 5, the inner compression plate 23 is seated within an interior cavity 35 of the outer compression plate 25 and is vertically displaceable therein relative to compression plate 25. Consequently, the inner compression plate 23 moves fully independent of the outer compression plate 25, and pressure changes experienced at the inner compression plate 23 via piston rod assemblies 19 will not affect compression plate 25. Similarly, pressure changes experience at the outer compression plate 25 via piston rod assemblies 21 will not affect compression plate 23. In this manner, when the socket lid 1 is connected to the test socket of a particular DUT, the force applied to the inner and outer portions of the DUT through piston rod assemblies 19 and 21 may be adjusted independently of one another, thus permitting the application of multiple zones of controlled and variable force to the DUT.

Completing the main body of socket lid assembly 1 is a pneumatic guard member or shroud 37 which protectively surrounds the lower compression plates 23 and 25. Shroud 37 is secured to the pneumatic cylinder casing 3 with a set of screws 39. As shown throughout the drawings, attached to opposing sides of the pneumatic cylinder casing 3 are a set of socket lid snap-locking latch members 51 which extend through corresponding channels 49 formed in the peripheral portions of the lower shroud 37. As shown in FIG. 4, each opposing latch member 51 is comprised of a pair of spaced catch elements 53 interconnected by dual female standoffs 55. Each catch element 53 is attached to the pneumatic cylinder casing 3 via a pivot pin 57.

As further seen on FIG. 4, the lower terminal end of each catch element 53 has an inwardly protruding shoulder or catch 59 for engaging a test socket for a particular DUT (not shown). Each latch member 51 is spring biased at its upper end by a set of compression springs 61 which function to bias the lower end of latch elements 53 inwardly. Accordingly, in use, when the socket lid assembly 1 is pressed down upon a test socket for a DUT, catch elements 53 of each latch member 51 will flex/pivot outwardly about pivots 57 and then snap back onto the test socket so as to lock the socket lid 1 thereto. If removal is desired, the latch members 51 may be pinched inwardly at their upper ends to pivot the same about pivots 57 to an unlocked position.

In certain applications, it may also be necessary or desirable to incorporate a DUT cooling system into the socket lid 1. Accordingly, as shown in FIG. 4, it is contemplated that a pair of threaded openings 63 and 65 may be incorporated in the side of the inner compression plate 23 for the introduction of a cooling fluid to a water block 67 which is affixed to the lower interior portion of the inner compression plate 23. In this manner, a cooling fluid may be introduced to maintain thermal control of the DUT in certain required applications.

Figure 2:
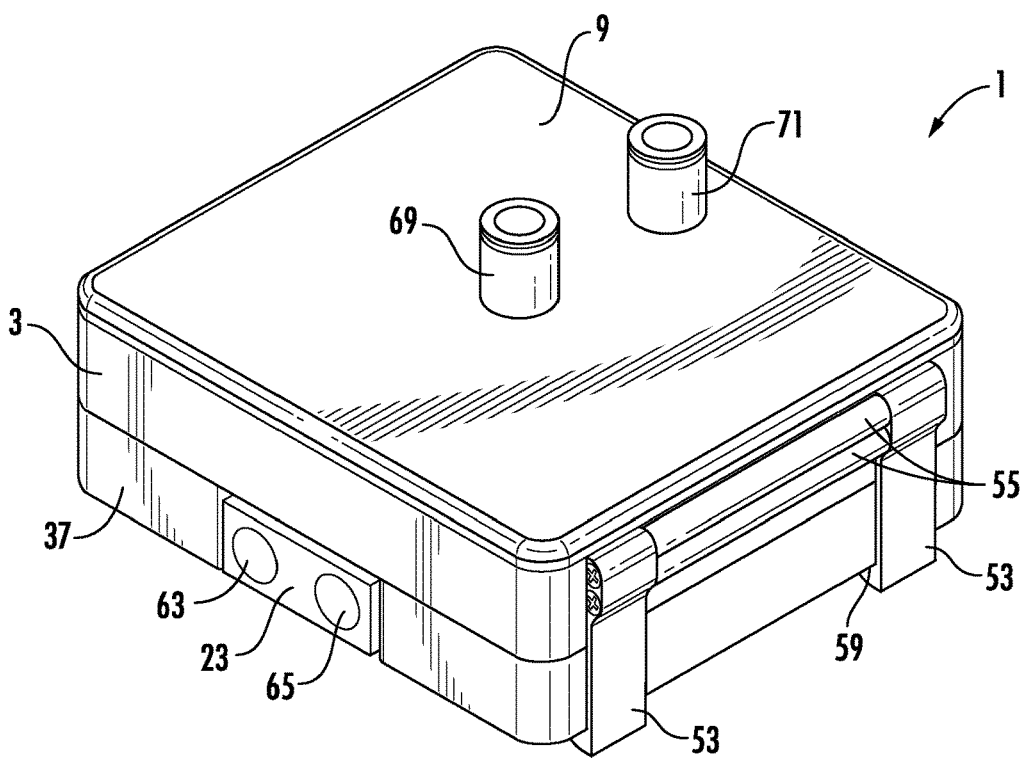
FIG. 2 is a perspective view of the pneumatic socket lid assembly shown in FIG. 1 with the socket lid cover reattached, and further showing the supply air fittings in the socket lid cover for operating the integrated pneumatic cylinders of the socket lid assembly.
Figure 3:
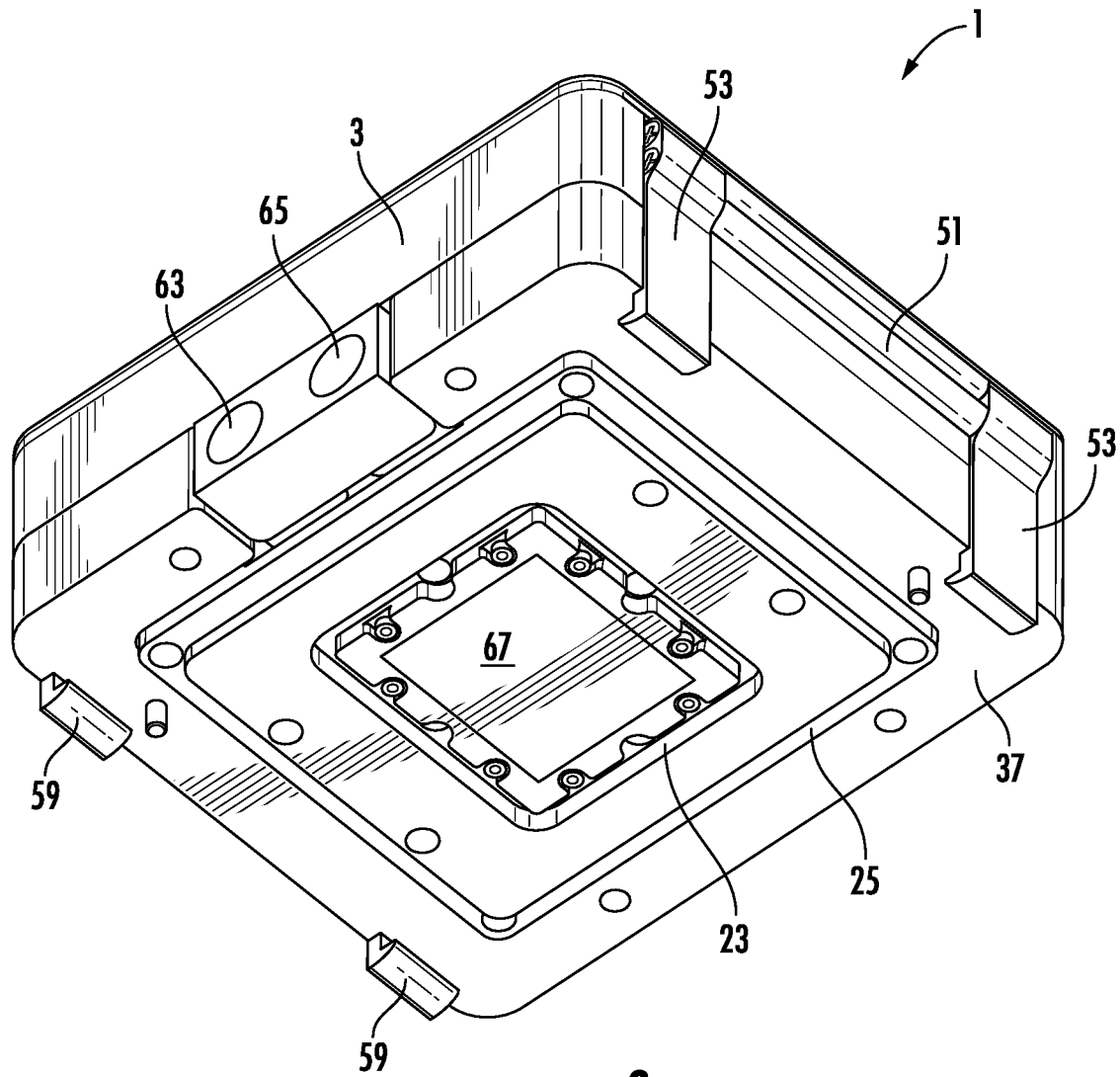
FIG. 3 is a perspective view of the pneumatic socket lid assembly shown in FIGS. 1 & 2, taken from the bottom side thereof.

As shown best in FIGS. 2 and 4, air pressure to the individual pressure chambers 5 and 7, and consequently to the piston rod assemblies 19 and 21 contained within the pneumatic cylinder casing 3, is supplied through air supply fittings 69 and 71, respectively, mounted in the socket lid cover 9. Air supply fitting 69 connects fluidly to pressure chamber 5 and air supply fitting 71 connects fluidly to pressure chamber 7 of the pneumatic cylinder casing 3. The air pressure provided to chambers 5 and 7, and thus to piston rod assemblies 19 and 21, is supplied from a source of compressed air (not shown) which is readily adjustable.

Accordingly, with the present invention, force applied to a DUT can be varied depending on the amount of regulated air pressure that is applied to the piston rod assemblies 19 and 21 within the pneumatic cylinder casing 3. No tedious mechanical adjustments are necessary. Since the air is already compressed in a laboratory environment, the effort exerted to set and adjust the force is replaced with the ease of simply regulating the air pressure. There are a variety of ways to regulate air pressure, but all require a minimal amount of user effort. The applied force is also controlled by the accuracy of the regulated air instead of the precision of socket lid components, thus eliminating the impact of the component's tolerance stack.

This approach eliminates any issues with space limitations and allows for the use of more than one cylinder in the assembly. Having more than one cylinder also allows for the compression force to self-level against the DUT. The number of cylinders or piston rod assemblies (19, 21) and their size is only limited by the footprint of the lid solution, which allows for multiple zones of controlled force to be applied against the DUT.

Since air is compressible it has the added benefit of functioning as a shock absorber. This allows for mechanical and thermal shocks to be mitigated by the compressed air itself instead of impacting the applied force. This is similar to the benefits of a spring-loaded lid assembly with the added benefit of being able to adjust the exerted force by changing pressure.

With this approach, any size and number of cylinders can be integrated into a socket lid. The length of each cylinder can also be configured based on the application. Utilizing such a pneumatic socket lid assembly 1 also eliminates the change of material properties over temperature and the applied force is strictly controlled by the pressure exerted on the pneumatic cylinders. This makes for an ideal solution in restrictive test systems where a change in applied force is not allowed.

In certain applications, a change in contact resistance (CRES) can also cause test failure. With the pneumatic socket lid approach, the CRES may be stabilized over temperature changes by adjusting the applied force during testing so as to maintain a steady CRES value. To accomplish this simply requires an adjustable force pneumatic socket lid assembly 1 and a Proportional-Integral-Derivative (PID) control interface (not shown) to monitor the CRES in real-time to continually adjust the applied pressure to the pneumatic lid assembly 1.

By utilizing a pneumatic lid solution, the force being applied to the DUT can be positioned freely, thus allowing the flexibility to create cutouts in the lid assembly. These cutouts can be strategically placed to expose RF emitting components of a DUT which can easily be improperly shielded or covered during testing with conventional socket lid configurations.

Finally, it should be noted that, for the sake of simplicity, the present disclosure has been limited to a two-zone system for applying variable pressure to the inner and outer peripheral portions of a semiconductor DUT. However, it will be appreciated and understood that other and additional configurations incorporating multiple additional pressure zones are conceivable without departing from the invention herein. Also, for the sake of simplicity, the disclosure herein has been limited to the use of compressed air in the pneumatic system. However, it will be readily appreciated and understood that other compressed gaseous fluids (or possibly liquid) could be used without departing from the invention herein.

The disclosure herein is intended to be merely exemplary in nature and, thus, variations that do not depart from the gist of the disclosure are intended to be within the scope of the disclosure. Such variations are not to be regarded as a departure from the spirit and scope of the disclosure, which comprises the matter shown and described herein, and set forth in the appended claims.

We claim:

1. A pneumatic socket lid assembly for a semiconductor test socket used to test an electronic circuit device, comprising:
   (a) a cylinder casing having multiple independently sealed pressure chambers, each of said pressure chambers having a fluid source and at least one pneumatically controlled piston rod assembly which is movable within a piston bore opening formed in said cylinder casing in response to changes in fluid pressure within said pressure chamber;
   (b) a separate compression plate being individually associated with each of said pressure chambers and movably mounted to said cylinder casing in engaging relation with said piston rod assembly of said associated pressure chamber;
   (c) each said compression plate being independently movable relative to other said compression plates in response to movement of said piston rod assembly caused by fluid being introduced from said fluid source to said associated pressure chamber; and
   (d) a locking mechanism connected to said cylinder casing for attaching said cylinder casing to the semiconductor test socket to facilitate application of an adjustably variable force through said piston rod assemblies to multiple zones of the electronic circuit device.

2. The pneumatic socket lid assembly set forth in claim 1, wherein said cylinder casing includes a socket lid cover which integrates with said multiple pressure chambers to seal said chambers from one another and provide an input port for said fluid source thereto.

3. The pneumatic socket lid assembly set forth in claim 2, wherein said piston bore opening for said piston rod assembly of each said pressure chamber extends through said cylinder casing between said socket lid and an opposing surface of said cylinder casing located adjacent said associated compression plate.

4. The pneumatic socket lid assembly set forth in claim 1, wherein each said compression plate is connected to said cylinder casing via a set of compression springs which bias said compression plate against said piston rod assembly of said associated pressure chamber.

5. The pneumatic socket lid assembly set forth in claim 1, wherein said piston rod assembly within each said chamber includes a piston rod which reciprocates in sealed relation against a bore wall of said piston bore in response to variations in said fluid pressure being introduced into said associated pressure chamber.

6. The pneumatic socket lid assembly set forth in claim 1, wherein said locking mechanism includes a spring mechanism which facilitates a snap-lock engagement and releasable connection of said cylinder casing to the semiconductor test socket.

7. The pneumatic socket lid assembly set forth in claim 6, wherein said locking mechanism extends outwardly from said cylinder casing and includes a terminal catch member which is adapted to engage the semiconductor test socket upon application of a connecting force to said cylinder casing.

8. The pneumatic socket lid assembly set forth in claim 6, wherein said cylinder casing includes at least one cut-out extending therethrough to permit exposure of certain areas of the electronic circuit device carried by the semiconductor test socket to which the socket lid is attached.

9. The pneumatic socket lid assembly set forth in claim 1, including a Proportional-Integral-Derivative control interface device to monitor contact resistance associated with the electronic device under test to facilitate adjustment of the applied pressure to said chambers of said cylinder casing in response thereto.

10. The pneumatic socket lid assembly set forth in claim 1, including a fluid circulation block affixed to at least one of said compression plates for the introduction of a cooling fluid to the socket lid assembly.

11. A pneumatic socket lid assembly for a semiconductor test socket used to test an electronic circuit device, comprising:
   (a) a first set of pneumatic cylinders with a first adjustable fluid input source being aligned with a first area of an electronic circuit device carried by the semiconductor test socket;
   (b) a second set of pneumatic cylinders with a second adjustable fluid input source being aligned with a second area of said electronic circuit device which is separate from said first area;
   (c) a first compression plate being positioned between said first set of pneumatic cylinders and said first area of said electronic circuit device, said first compression plate being operably engaged by said first set of pneumatic cylinders for applying pressure to said first area of said electronic circuit device;
   (d) a second compression plate, independently movable relative to said first compression plate, being positioned between said second set of pneumatic cylinders and said second area of said electronic circuit device, said second compression plate being operably engaged by said second set of pneumatic cylinders for applying pressure to said second area of said electronic circuit device; and
   (e) a releasable locking mechanism affixed to said first set and said second set of pneumatic cylinders for connecting said first set and said second set of pneumatic cylinders and said first and said second compression plates to the semiconductor test socket to facilitate application of an adjustable force separately from said first set and said second set of pneumatic cylinders to said first area and said second area, respectively, of said electronic circuit device.

12. The pneumatic socket lid assembly set forth in claim 11, wherein said first set of pneumatic cylinders and said second set of pneumatic cylinders are formed integrally as part of a unified cylinder casing.

13. The pneumatic socket lid assembly set forth in claim 12, wherein said first set of pneumatic cylinders are fluidly sealed from said second set of pneumatic cylinders by said cylinder casing.

14. The pneumatic socket lid assembly set forth in claim 12, wherein said cylinder casing defines a first common fluid pressure chamber for said first set of pneumatic cylinders with which said first fluid input source communicates, and said cylinder casing defines a second common fluid pressure chamber for said second set of pneumatic cylinders with which said second fluid input source communicates, said first pressure chamber being fluidly sealed from said second pressure chamber.

15. The pneumatic socket lid assembly set forth in claim 14, wherein said first fluid pressure chamber and said second fluid pressure chamber of said cylinder casing each include a plurality of piston bore openings which carry movable piston rod assemblies of said first set and said second set of pneumatic cylinders, respectively.

16. The pneumatic socket lid assembly set forth in claim 12, wherein said cylinder casing includes at least one cut-out extending therethrough to permit exposure of certain areas of said electronic circuit device which is carried by the semiconductor test socket.

17. The pneumatic socket lid assembly set forth in claim 11, wherein said locking mechanism includes a spring mechanism and catch member which facilitates a releasable snap-locking connection of said first set and said second set of pneumatic cylinders, and said first and said second compression plates, to the semiconductor test socket.

18. A pneumatic socket lid assembly for a semiconductor test socket used to test an electronic circuit device, comprising:
(a) a cylinder casing having a plurality of independently sealed fluid pressure chambers;
(b) one of said plurality of pressure chambers integrally forming as a part thereof a first set of pneumatic cylinders with a first adjustable fluid input source, said first set of pneumatic cylinders being adapted for alignment with a first area of an electronic circuit device carried by the semiconductor test socket;
(c) another of said plurality of pressure chambers forming as a part thereof a second set of pneumatic cylinders with a second adjustable fluid input source, said second set of pneumatic cylinders being adapted for alignment with a second area of said electronic circuit device which is separate from said first area;
(d) a first compression plate being movably connected to said cylinder casing between said first set of pneumatic cylinders and said first area of said electronic circuit device, said first compression plate being operably engaged by said first set of pneumatic cylinders for applying pressure to said first area of said electronic circuit device;
(e) a second compression plate movably connected to said cylinder casing independent from said first compression plate, said second compression plate being positioned between said second set of pneumatic cylinders and said second area of said electronic circuit device, said second compression plate being operably engaged by said second set of pneumatic cylinders for applying pressure to said second area of said electronic circuit device; and
(f) a locking mechanism connected to said cylinder casing for attaching the pneumatic socket lid assembly to the semiconductor test socket to apply an adjustable force through said first set and said second set of pneumatic cylinders to multiple zones of said electronic circuit device, said locking mechanism including a spring mechanism and catch member which facilitates a releasable snap-locking engagement of said cylinder casing to the semiconductor test socket.

19. The pneumatic socket lid assembly set forth in claim 18, wherein said pressure chamber of said first set of pneumatic cylinders and said pressure chamber of said second set of pneumatic cylinders each include a plurality of piston bore openings integrally formed with said cylinder casing which carry movable piston rod assemblies of said first set and said second set of pneumatic cylinders, respectively.

20. The pneumatic socket lid assembly set forth in claim 19, wherein said piston rod assemblies are sealed relative to said bore openings and include piston rods which protrude from said cylinder casing and engage said first and said second compression plates associated with said first set and said second set of pneumatic cylinders, respectively.

* * * * *